(12) United States Patent
Nagano et al.

(10) Patent No.: US 7,105,830 B2
(45) Date of Patent: Sep. 12, 2006

(54) RADIATION DETECTING DEVICE AND METHOD OF MANUFACTURING THE SAME

(75) Inventors: Kazumi Nagano, Kanagawa (JP); Tomoyuki Tamura, Saitama (JP); Satoshi Okada, Kanagawa (JP); Katsuro Takenaka, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 318 days.

(21) Appl. No.: 10/795,352

(22) Filed: Mar. 9, 2004

(65) Prior Publication Data
US 2004/0178350 A1 Sep. 16, 2004

(30) Foreign Application Priority Data
Mar. 12, 2003 (JP) .............................. 2003-066728

(51) Int. Cl.
*G01T 1/20* (2006.01)

(52) U.S. Cl. ................................................ 250/370.11
(58) Field of Classification Search ............ 250/370.11
See application file for complete search history.

(56) References Cited

U.S. PATENT DOCUMENTS 5,793,047 A 8/1998 Kobayashi, et al. ... 250/370.09
5,965,872 A 10/1999 Endo, et al. ............. 250/208.1
6,469,305 B1 10/2002 Takabayashi, et al. ...... 250/361
6,949,750 B1 * 9/2005 Tsutsui et al. ......... 250/370.11
2002/0121606 A1 9/2002 Okada, et al. ......... 250/370.11
2002/0162965 A1 11/2002 Okada, et al. ......... 250/370.11
2004/0096035 A1 5/2004 Yamazaki, et al. ............ 378/97

* cited by examiner

*Primary Examiner*—David Porta
*Assistant Examiner*—Shun Lee
(74) *Attorney, Agent, or Firm*—Fitzpatrick, Cella, Harper & Scinto

(57) ABSTRACT

In a radiation detecting device having a sensor panel in which a plurality of photoelectric conversion elements are formed on one surface of a support substrate, a moisture-proof protective layer is laminated on a surface of the sensor panel on which the photoelectric conversion elements are formed, and a warp correction layer is laminated on the other surface of the sensor panel, and the moisture-proof protective layer and the warp correction layer are formed of a resin film having a drawing or extrusion direction, respectively, and bonded together so as to make the drawing or extrusion directions of both the resin films similar to each other. With the formation of the radiation detecting device, the warp of the radiation detection panel induced by a thermal displacement is prevented.

10 Claims, 5 Drawing Sheets

RADIATION DETECTING DEVICE AND METHOD OF MANUFACTURING THE SAME

BACKGROUND OF THE INVENTION

1. Field of the Invention

The present invention relates to a radiation detecting device that detects as an electric signal a radiation, which is employed in a medical diagnosis device, a nondestructive test device or the like, and a method of manufacturing the radiation detecting device. In the present invention, electromagnetic waves such as x-rays, $\alpha$-rays, $\beta$-rays and $\gamma$-rays are also included in the radiation.

2. Related Background Art

Up to now, an x-ray film system having a phosphor screen having x-ray phosphors therein and a both-side coated sensitizing agent has been generally employed for electrography. However, in recent years, from the viewpoints of such advantages that an image characteristic of a digital radiation detecting device having an x-ray phosphor layer and a two-dimensional sensor panel is excellent, and data is shared by downloading the data into a networked computer system because the data is digital data, the digital radiation detecting device has been actively researched and developed, and various patent applications for the digital radiation detecting device have been filed.

Among those digital radiation detecting devices, there has been known, as a device high in the sensitivity and sharpness, a radiation detecting device in which a radiation detection scintillator having a phosphor layer on a substrate that transmits the radiation is bonded onto and integrated with a sensor panel having a plurality of photoelectric conversion elements arranged on a transmittable support substrate and electric elements such as TFTs arranged, in the gaps of the respective photoelectric conversion elements, as disclosed in U.S. Pat. No. 5,793,047 and U.S. Pat. No. 6,469,305.

In the above-mentioned conventional example, the phosphors are laminated on a front surface of the transmittable support substrate on which the photoelectric conversion elements are arranged, whereas a light absorption layer is laminated on a back surface of the transmittable support substrate. In addition, the surface on which the light absorption layer is disposed is bonded to a base through an adhesive.

The light absorption layer on the back surface of the transmittable support substrate of the sensor panel as disclosed in the above conventional example is provided for the purposes of antireflection and light shielding, and solves such a problem that a light to be received such as a light emitted from the phosphor layer is reflected by portions other than the photoelectric conversion portion, such as the back surface of the transmittable support substrate or an edge portion of the substrate, to be received. The light absorption layer is provided by forming a resin directly on the transmittable support substrate through coating and printing processes.

The radiation detection scintillator of the conventional example suffers from the following problems during the process or in an acceleration test of a long-term durability test.

(1) The respective structural layers are displaced due to a heat in a heat history during the process or during the durability, with the result that there arises such a problem that the respective layers are warped due to the displacement, an internal stress is applied to the phosphors and the respective structural layers, and a layer weak in the stress is destroyed or peeled off due to the internal stress.

(2) The respective structural layers are displaced due to a heat in the heat history during the process. Up to now, the sensor panel has been warped by the displacement because a large number of layers are formed on the front surface of the sensor panel in which the photoelectric conversion elements are arranged. There may arise such problems as an improper installation position or a connection failure due to the warp of the sensor panel in the case where a crimp type terminal is installed on an electrode lead pad potion on the panel for electric wiring connection. Also, in some cases, the connection portion is damaged, and the connection fails due to the warp stress of the sensor panel during the acceleration durability.

(3) The sensor panel is flowed while the panel is mounted on a carrying holder, and in the case where the support substrate back surface comes in contact with a surface of the carrying holder, the light absorption is grazed and damaged or peeled off due to a mechanical friction in the case of the conventional material, with the result that the light shielding on the defective portion becomes insufficient, to thereby increase the image defects.

The conventional examples disclosed up to now teach nothing of the structural material of the panel back surface side and the laminating manner taking the stress after laminating into consideration.

SUMMARY OF THE INVENTION

The present invention has been made in view of the above circumstances, and therefore an object of the present invention is to provide a radiation detecting device with a high reliability and a method of manufacturing the radiation detecting device, in which a protective layer is laminated on one surface side of a sensor panel having a plurality of photoelectric conversion elements formed on one surface of a support substrate, on which the photoelectric conversion elements are formed, and a warp correction layer is laminated on the other surface of the sensor panel, both of the protective layer and the warp correction layer are formed of a resin film having a drawing or extrusion direction, a warp induced due to a heat displacement is corrected by bonding both of the resin films together so as to make the drawing or extrusion directions of those resin films similar to each other to prevent the peeling off and breakdown of the respective structural layers.

That is, according to the present invention, there is provided a radiation detecting device having a sensor panel in which a plurality of photoelectric conversion elements are formed on one surface of a support substrate, the device being characterized in that: a protective layer formed of a first resin film having a drawing or extrusiondirection is laminated on a surface of the sensor panel on which the plurality of photoelectric conversion elements are formed; a second resin film having a drawing or extrusion direction is laminated on the other surface of the sensor panel; and both the resin films are bonded so that the respective drawing or extrusion directions of both the resin films are made similar to each other.

Further, according to the present invention, there is provided a method of manufacturing a radiation detecting device comprising a sensor panel having a plurality of conversion elements formed on one surface of a supporting substrate, and a scintillator panel bonded to the sensor panel and having a phosphor layer for converting a radiation into light detectable by the plurality of conversion elements, characterized by including:

bonding a moisture-proof protective layer that is formed of a first resin film having a drawing or extrusion direction onto the scintillator panel; and bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

Further, according to the present invention, there is provided a method of manufacturing a radiation detecting device comprising a sensor panel having a plurality of conversion elements formed on one surface of a supporting substrate, and a phosphor layer for converting a radiation into light detectable by the plurality of conversion elements, the phosphor layer being formed on a surface side of the sensor panel on which the conversion elements are provided, characterized by including:

bonding a moisture-proof protective layer that is formed of a first resin film having a drawing or extrusion direction on the phosphor layer; and bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

Furthermore, according to the present invention, there is provided a method of manufacturing a radiation detecting device, characterized by including:

bonding a moisture-proof protective layer that is formed of a first resin film having a drawing or extrusion direction onto a surface side of a direct type sensor panel on which the plurality of conversion elements that convert radiation directly into electric signal are formed; and bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE PREFERRED EMBODIMENTS

Now, a description will be given in more detail of embodiments of the present invention with reference to the accompanying drawings.

(First Embodiment)

Figure 1:
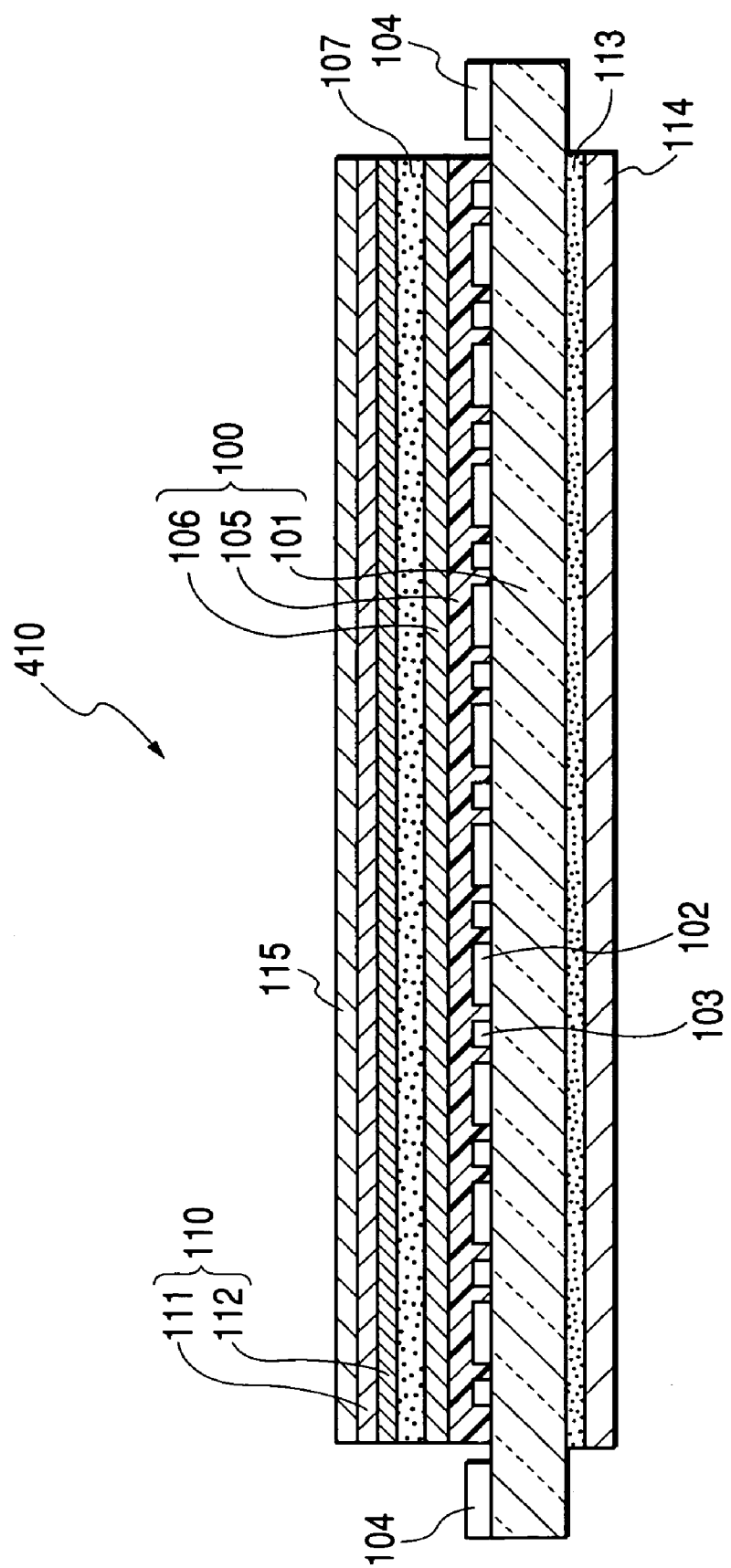
FIG. 1 is a cross-sectional view showing the structure of a radiation detection panel in a radiation detecting device in accordance with a first embodiment of the present invention.

FIG. 1 is a cross-sectional view showing the structure of a radiation detection panel in a radiation detecting device in accordance with a first embodiment of the present invention.

Referring to FIG. 1, reference numeral 410 denotes the entirety of a radiation detection panel, 101 is a glass substrate (support substrate), 102 is a photoelectric conversion element portion including photoelectric conversion elements which are photosensors made of amorphous silicon and TFTs, 103 are wiring portions, 104 are electrode lead portions, 105 is a first panel protective layer made of silicon nitride or the like, and 106 is a second panel protective layer formed of a resin film or the like. Also, reference numeral 111 denotes a resin film layer that supports a phosphor layer 112 coated with a phosphor protective layer which also serves as a phosphor coated substrate. The phosphor is one example of a scintillator or a wavelength conversion member. A sensor panel 100 is formed of the components 101 to 106, and a scintillator panel 110 is formed of the components 111 and 112. The scintillator panel 110 is bonded to the sensor panel 100 through an adhesive 107.

Reference numeral 115 denotes a moisture-proof protective layer prepared mainly for the purpose of improving the durability of the phosphor and the sensor panel 100, which is made up of a metal layer high in the moisture-proof effect and a resin film layer that supports the metal layer. The resin film layer that supports the metal layer is formed on one or both surfaces of the metal layer, and formed of a resin film having a drawing or extrusion direction. The moisture-proof protective film 115 is laminated on the phosphor protective layer 111 by means of an adhesive (not shown).

Also, a warp correction layer 114 is laminated through an adhesive layer 113 on a surface of the sensor panel 100 on which the photoelectric conversion elements are not formed. The warp correction layer 114 is formed of a resin film having a drawing or extrusion direction. The thermal expansion coefficient of a material such as glass used for the support substrate 101 of the sensor panel 100 according to the present invention is 1 to $10 \times 10^{-6}/°$ C., the thermal expansion coefficient of a material such as Al used for the moisture-proof protective layer or the like is 15 to $25 \times 10^{-6}/°$ C., and the thermal expansion coefficient of a resin sheet is 1 to $5 \times 10^{-5}/°$ C. A difference in displacement between the respective layers due to the heat history is large.

Accordingly, in the laminate structure of the present invention, the warp occurs due to the displacement of the respective layers of the laminate after the heat history. Also, there has been known that because the resin film formed through the drawing or extrusion molding has the aspect that resin molecules are selectively arranged in the drawing and extrusion direction, the thermal expansion amount and the thermal contraction displacement amount are different between the drawing and extrusion direction and non-drawing and non-extrusion direction.

Figure 2:
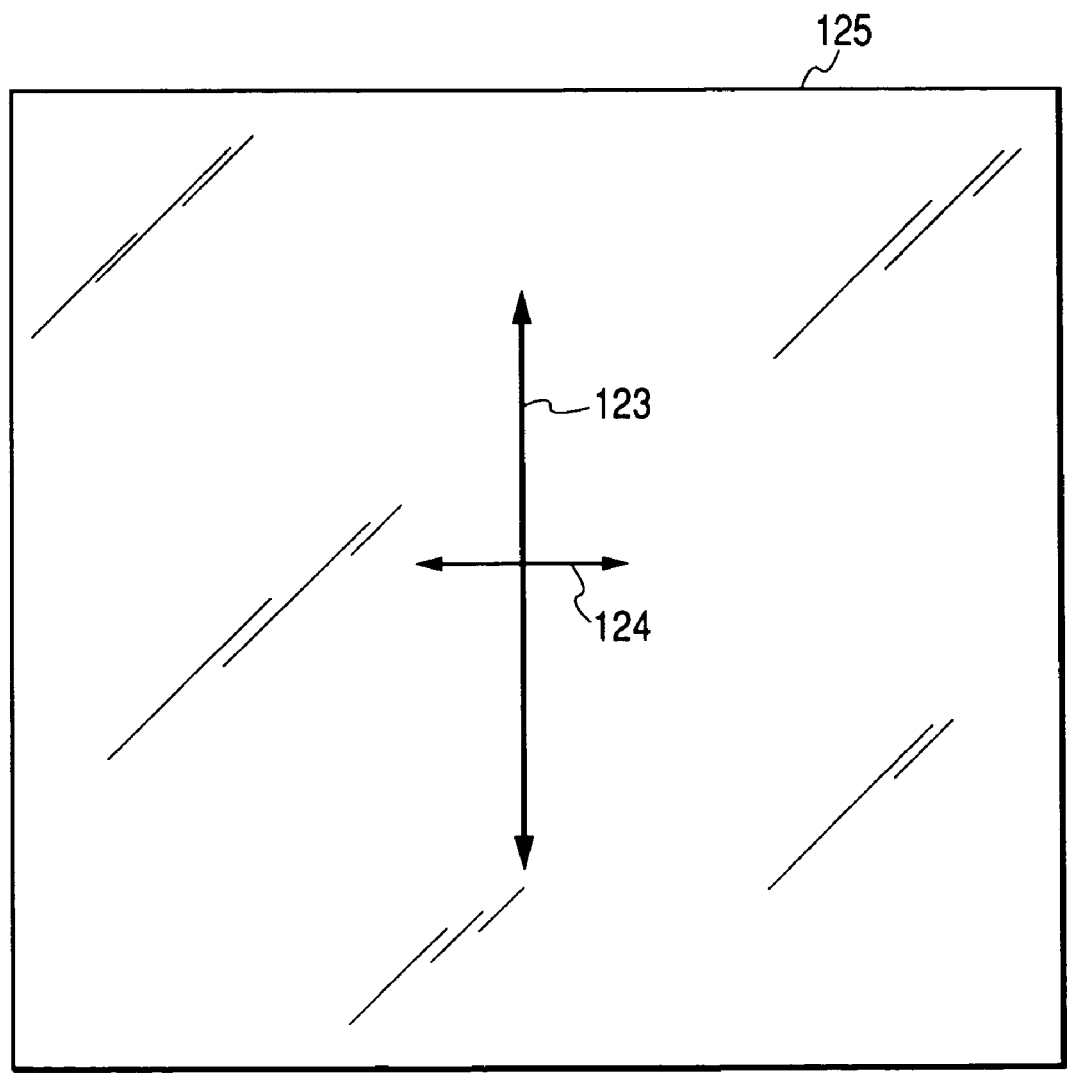
FIG. 2 is a diagram showing the aspect of a resin film in the radiation detection panel in accordance with the present invention.

FIG. 2 is a diagram showing an aspect of the resin film in the radiation detection panel in accordance with the present invention. In the resin film 125, the drawing and extrusion direction and the non-drawing and non-extrusion direction are indicated by reference numeral 123 and 124, respectively.

For example, in a polyethylene terephthalate film which is the most common resin film, the thermal expansion coefficient at approximately a room temperature is $1.2 \times 10^{-5}$ cm/cm/° C. in the drawing and extrusion direction and $1.6 \times 10^{-5}$ cm/cm/° C. in the non-drawing and non-extrusion direction. The thermal contraction displacement ratio at approximately 100° C. is 0.25% in the drawing and extrusion direction and 0% in the non-drawing and non-extrusion direction. Therefore, in the case where the scintillator panel 110 and the moisture-proof protective layer 115 are laminated on the photoelectric conversion element side of the sensor panel 100, the dimensional displacements of the resin films of the phosphor protective layer 111 and the moisture-proof protective layer 115 occur with the displacement amounts different between the drawing and extrusion direction and the non-drawing and non-extrusion direction due to the heat history in the process or durability. Accordingly, the aspect direction of the resin film becomes a factor that determines the warp direction of the sensor panel.

Therefore, in the present invention, the moisture-proof protective layer 115 and the warp correction layer 114 are bonded to the sensor panel 100 with interposition of adhesive layers, respectively, in such a manner that the drawing and extrusion direction of the resin film of the warp correction layer 114 that is stuck on an opposite surface of the sensor panel 100 having a surface on which the moisture-proof protective layer 115 is formed is made similar to the direction of the resin film of the moisture-proof protective layer 115, with the result that the amount of warp of the sensor panel 100 can be corrected.

For example, in the case where not only the moisture-proof protective layer 115 but also the phosphor protective layer 111 is formed of the resin film, the phosphor protective layer 111 and the moisture-proof protective layer 115 are bonded onto the sensor panel so as to make the drawing and extrusion direction of the phosphor protective layer 111 similar to that of the moisture-proof protective layer 115. In addition, the thicknesses of both the layers and the specific thermal displacement characteristic of the material to be used are calculated, and the warp correction layer 114 having the material, the aspect and the thickness thereof which can be corrected in accordance with the displacement amount can be disposed so as to make the resin aspect in the similar direction.

Also, the warp correction layer 114 is bonded to a surface of the sensor panel 100 on which the photoelectric conversion elements are not formed. For example, it is desirable that the warp correction layer 114 and the adhesive layer 113 have a light absorption and a light shielding function because there is no case in which a light to be received which is emitted from the phosphor layer 112 is reflected and received on a back surface of the support substrate other than the photoelectric conversion portion, and there is no case in which a light leaked from the external enters the back surface of the sensor panel 100 and is received. Also, it is sufficient that the light absorption function and the light shielding function are conducted by a two-layer structure consisting of the warp correction layer 114 and the adhesive layer 113, i.e. one of the adhesive layer 113, and the resin film of the warp correction layer may be provided with the light absorption and light shielding functions, or both of the adhesive layer 113 and the resin film of the warp correction layer may be provided with the light absorption and light shielding functions.

In the case where the adhesive layer 113 side is provided with the light absorption function, the restriction of the resin film layer is small, and in the case where the adhesive layer 113 is transparent, an index difference between the adhesive layer 113 and the support substrate 101 can be set to be as small as possible, preferably ±5%, and it is necessary to suppress the reflection on the interface and to provide the resin film layer with the light absorption function. In order to provide the adhesive layer 113 with the light absorption property and the light shielding property, an organic pigment or an inorganic pigment may be contained in those resins. The organic pigment may be nitro dye, azo pigment, and indanthrene, thioindigo perynone, perylene, dioxazine, quinacridone, phthalocyanine, isoindolinone, and quinophthalone pigments. The inorganic pigment may be carbon black, chrome yellow, cadmium yellow, clover million (orange) colcothar, vermillion, red lead, cadmium red, mineral violet (purple), cobalt blue, cobalt green, chromium oxide, indium oxide, tin oxide, viridian (green), and so on. Similarly, in order to provide the film layer with the light absorption property, the above-mentioned pigments may be contained in the film layer. In addition, black printing may be made on the adhesive layer side of the film layer.

Also, in the case where the resin film of the warp correction layer 114 is provided with the light absorption function, the light absorption function can be provided by mixing a pigment such as carbon black at the time of forming the resin film. However, the amount of pigment which can be contained in the resin film is about 30 wt % as a limit of forming the resin film. In the case where the light shielding property is short when the resin film is thinned, it is desirable that particles such as carbon black which is high in the light shielding property and the light absorption property are sprayed on the surface of the resin film to form the resin film so as to improve the light shielding performance of the resin film.

The scintillator panel 110 and the moisture-proof protective layer 115 are disposed on the surface of the sensor panel 100 on which the photoelectric conversion elements are formed, and the warp correction layer 114 is disposed on the other surface of the sensor panel 100, thereby structuring the radiation detection panel 410.

Any material for a resin film which has been sheet-molded so as to have the drawing and extrusion direction may be applied to the material to be used for the resin films in the present invention. The material may be, for example, polyethylene terephthalate resin, polypropylene resin, polycarbonate resin, chloroethene resin, vinylidene chroride resin, ABS resin, polyimide resin, or the like.

(Second Embodiment)

Figure 3:
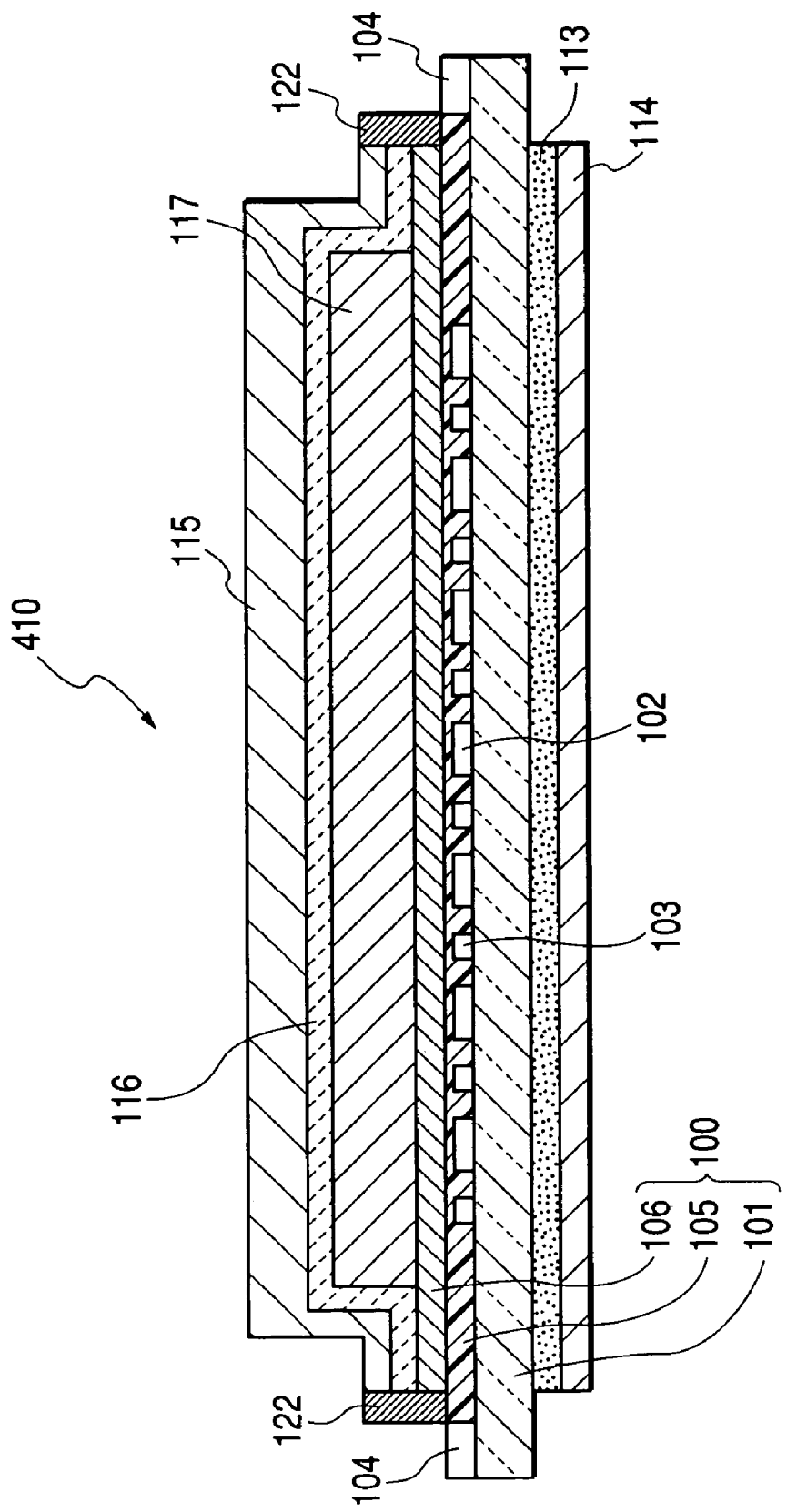
FIG. 3 is a cross-sectional view showing the structure of a radiation detection panel in a radiation detecting device in accordance with a second embodiment of the present invention.

FIG. 3 is a cross-sectional view showing the structure of a radiation detection panel in a radiation detecting device in accordance with a second embodiment of the present invention.

Reference numeral 101 denotes a glass substrate (support substrate), 102 is a photoelectric conversion element portion including photoelectric conversion elements which are made of amorphous silicon and TFTs, 103 are wiring portions, 104 are electrode lead portions, 105 is a first panel protective layer made of silicon nitride or the like, and 106 is a second panel protective layer formed of a resin film or the like. Also, reference numeral 117 denotes a phosphor layer which is formed of a columnar phosphor. In this embodiment, the phosphor is an example of the scintillator or the wavelength conversion element. Reference numeral 116 denotes a reflective layer that reflects the light emitted from the phosphor toward the sensor panel side, which is constructed such that at least two layers of the organic protective film and the metal reflective layer are laminated so as to protect the metal reflective layer by the organic material film. The metal reflective layer to be used is desirably a metal high in the reflectivity such as Al, Ag, Cr, Cu, Ni, Ti, Mg, Rh, Pt or Au. Also, the organic material layer that covers the reflective layer is disposed for the purposes of protecting the metal reflective film and protecting the moisture proof of the phosphor layer, and it is desirable to use a CVD film such as polyparaxylylene which is high in the moisture proof property as disclosed in U.S. Pat. No. 6,469,305, although any material may be applied to the organic material layer if the above objects can be achieved.

Reference numeral 115 denotes a moisture-proof protective layer which is disposed mainly for the purposes of improving the durability of the phosphor and the sensor panel, which is made up of a metal layer disposed in addition to the reflective layer since the moisture-proof effect is high, and a resin film layer that supports the metal layer. The resin film layer that supports the metal layer is formed on one or both surfaces of the metal layer, and is formed of a resin film having the drawing or extrusion direction. The moisture-proof protective layer 115 is laminated on a reflective layer 116 through an adhesive layer (not shown). Also, a warp correction layer 114 is laminated on a surface of the sensor panel on which the photoelectric conversion elements are not formed through an adhesive layer 113. The warp correction layer 114 is formed of a resin film having the drawing or extrusion direction.

A sensor panel 100 is formed of the components 101 to 106, and the phosphor layer 117, the reflective layer 116 and the moisture-proof protective layer 115 are laminated on each other, and the end portions of the moisture-proof protective layer 115 is sealed with a sealing portion 122, to thereby obtain a radiation detection panel 410. Likewise, in this embodiment, the warp of the radiation detection panel can be corrected by bonding the resin film of the moisture-proof protective layer 115 onto the panel in such a manner that the drawing and extrusion direction of the moisture-proof protective layer 115 is made similar to that of the warp correction layer 114. In particular, in the case where the phosphor is the phosphor 117 made of columnar crystal, there is a case in which there occurs a fatal defect that the phosphor is broken due to the occurrence of the warp, and the effect of the stress relaxation through the warp correction is high. Also, the warp correction layer 114 or the adhesive layer 113 may be provided with the light shielding function and the light absorption function as in the first embodiment.

(Third Embodiment)

Figure 4:
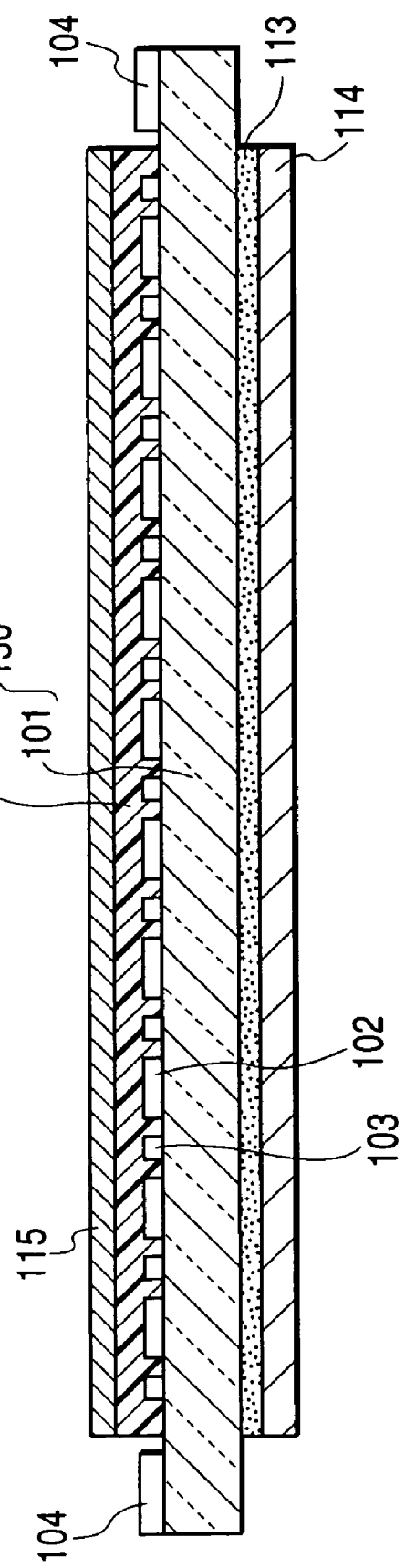
FIG. 4 is a cross-sectional view showing the structure of a radiation detection panel in a radiation detecting device in accordance with a third embodiment of the present invention.

FIG. 4 is a cross-sectional view showing the structure of a radiation detection panel in a radiation detecting device in accordance with a third embodiment of the present invention.

Reference numeral 101 denotes a glass substrate (support substrate), 102 is a conversion element portion including radiation conversion elements that converts x-rays directly into an electric signal and TFTs, 103 are wiring portions, 104 are electrode lead portions; 131 is a protective layer, and a direct type sensor panel 130 is a sensor panel that can convert x-rays directly into the electric signal. The sensor panel 130 is formed of the components 101 to 104 and 131.

Reference numeral 115 denotes a moisture-proof protective layer prepared mainly for the purpose of improving the durability of the sensor panel, which is made up of a metal layer high in the moisture-proof effect and a resin film layer that supports the metal layer. The resin film layer that supports the metal layer is formed on one or both surfaces of the metal layer, and serves as not only the moisture proof but also a rigid protective layer of the sensor surface. The resin film layer is formed fo a resin film having a drawing or extrusion direction. The moisture-proof protective film 115 is laminated on the protective layer 131 by an adhesive layer (not shown). Also, a warp correction layer 114 is laminated on a surface of the sensor panel on which the photoelectric conversion elements are not formed through an adhesive layer 113. The warp correction layer 114 is formed of a resin film having a drawing or extrusion direction.

Likewise, in this embodiment, the warp of the radiation detection panel can be corrected by bonding the resin film of the moisture-proof protective layer 115 onto the panel in such a manner that the drawing and extrusion direction of the moisture-proof protective layer 115 is made similar to that of the warp correction layer 114.

As was described above, even if the phosphor is particles or phosphor made of columnar crystal, or also in the case where no scintillator is disposed in the sensor panel, and the radiation is converted directly into the electric signal, in order to prevent any trouble caused by the warp stress, it is possible to correct the warp of the radiation detection panel by bonding the resin film of the moisture-proof protective layer onto the panel so as to the drawing and extrusion directions of the moisture-proof protective layer similar to those of the warp correction layer in the first to third embodiments.

(Fourth Embodiment)

Figure 5:
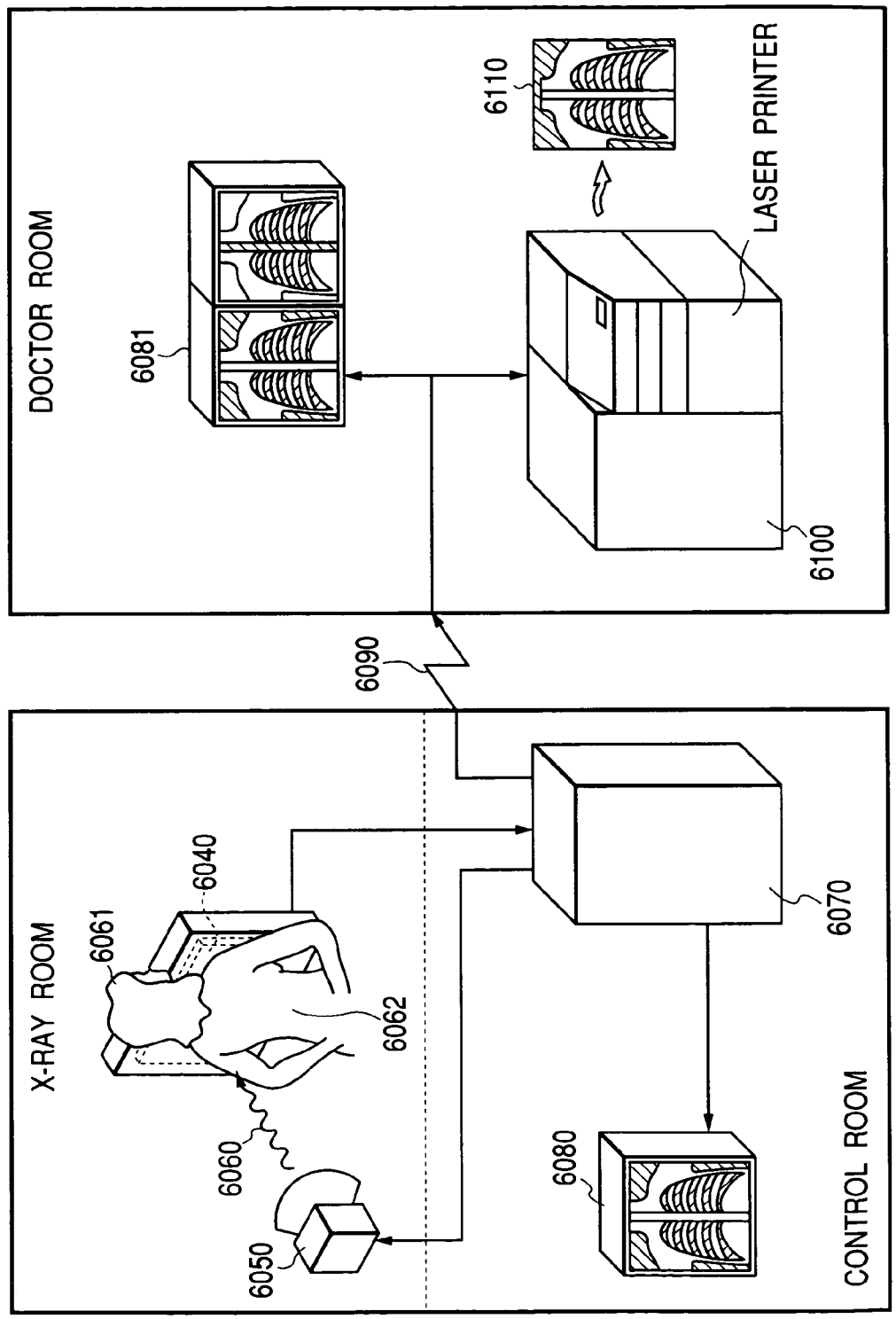
FIG. 5 is a diagram showing a radiation detecting system in accordance with a fourth embodiment of the present invention.

FIG. 5 is a diagram showing a radiation detection system in accordance with a fourth embodiment of the present invention.

In the radiation detection system, a radiation detecting device is utilized. X-rays 6060 generated by an x-ray tube 6050 transmits a chest region 6062 of a patient or a person to be examined 6061, and becomes then inputted to a radiation detecting device 6040. The information on the internal region of the patient 6061 is included in the incident x-rays. The phosphor of the radiation detecting device 6040 emits a light in accordance with the incidence of the x-rays, and the radiation detecting device 6040 subjects the emitted light to photoelectric conversion to obtain electric information. The information is subjected to digital conversion, subjected to image processing by an image processor 6070, and can be then observed by a display 6080 in a control room.

Also, the information can be transferred to a remote location by transmission means such as a telephone line 6090., can be displayed on a display 6081 or saved in a saving means such as an optical disk in a doctor room or the like at another location, so that a doctor at the remote location can diagnose the information. Also, the information can be recorded in a film 6110 through a film processor 6100.

Subsequently, a description will be given in more detail of examples of the radiation detecting device in accordance with the present invention.

First and second examples are related to the first embodiment, and the third example is related to the second embodiment.

FIRST EXAMPLE

As shown in FIG. 1, a photoelectric conversion element portion (pixels 430 mm×430 mm) 102 which is made up of the photoelectric conversion elements and the TFTs is formed on a semiconductor thin film made of amorphous silicon which is formed on a glass substrate 101 having an area of 450 mm×450 mm and a thickness of 0.7 mm. A protective layer 105 which is made of SiNx and a second protective layer 106 obtained by hardening polyimide resin are formed on the photoelectric conversion element portion 102 with the thickness of 4 µm. In addition, a black acryl ink is sprayed on a surface of the sensor panel on which the photoelectric conversion elements are not formed to form a light shielding function layer which is 5 µm in thickness, thereby fabricating the sensor panel 100.

Phosphor particles in which resin binders are dispersed in a sheet-roll-like PET resin film which is 188 im in thickness are formed on the phosphor protective layer 111 in the thickness of 180 µm by means of a coating technique to provide the phosphor layer 112, and thereafter the phosphor layer 112 is cut into the scintillator panel 110.

An Al foil with the thickness of 40 µm and a PET resin film 50 sheet roll are laminated through dry lamination, and an acrylic both-sided adhesive tape which is 50 µm in thickness (made by Sumitomo 3M Corp., 9313) is stuck on the Al surface side to prepare a resin film moisture-proof protective layer 115 of 440 mm×440 mm in which Al and PET are laminated.

An acrylic both-surface adhesive tape (made by Sumitomo 3M Corp., 9313) having a thickness of 50 µm is stuck onto a transparent PET sheet having a thickness of 250 im to prepare a PET sheet with an adhesive layer 113 for bonding, thus obtaining a warp correction layer 114 of 440 mm×440 mm.

The phosphor layer 112 side of the scintillator panel 110 thus obtained is bonded to the sensor panel 100 with an adhesive layer 107 of an acrylic adhesive agent (XSG), and a resin film of the moisture-proof protective layer 115 is bonded onto the resin film which is the phosphor protective layer 111 of the scintillator panel 110 so as to make the drawing directions of both the layers similar to each other. In addition, the warp correction layer 114 is bonded onto a surface of the sensor panel 100 on which the photoelectric conversion elements are not formed, that is, a surface on which the scintillator panel 110 is not disposed, so as to make the drawing direction of the resin film of the moisture-proof protective layer 115 in the similar direction to structure a radiation detection panel.

SECOND EXAMPLE

A photoelectric conversion element portion (pixel) 102 consisting of the photoelectric conversion elements and the TFTs are formed on a semiconductor thin film which is made of amorphous silicon on a glass substrate 101 as shown in FIG. 1, and a protective film 105 which is made of SiNx and a second protective layer 106 obtained by hardening a polyimide resin are formed on the photoelectric conversion element portion 102 to prepare a sensor panel 100.

A scintillator panel 110 and a moisture-proof protective layer 115 are prepared as in the first example.

An acrylic both-surface adhesive tape (made by Sumitomo 3M Corp., 9313) having a thickness of 50 µm is bonded onto a black PET sheet having a thickness of 100 im (made by Panak) to prepare a PET sheet with an adhesive layer for bonding, to thereby obtain a warp correction layer 114 of 440 mm×440 mm having a light shielding function and a light absorption function.

The respective layers are bonded onto the sensor panel 100 thus obtained as in the first example. The bonding is made in such a manner that the drawing directions of the respective resin films of the phosphor protective layer 111, the moisture-proof protective layer 115 and the warp correction layer 114 become similar to each other to structure a radiation detection panel.

THIRD EXAMPLE

A photoelectric conversion element portion (pixel) 102 consisting of the photoelectric conversion elements and the TFTs are formed on a semiconductor thin film which is made of amorphous silicon on a glass substrate 101 as shown in FIG. 3, and a protective film 105 which is made of SiNx and a second protective layer 106 obtained by hardening a polyimide resin are formed on the photoelectric conversion element portion 102 to prepare a sensor panel 100.

Then, a phosphor layer 117 which is made of alkali halide and has been crystallized in the form of a column is formed in the thickness of 500 im on the sensor panel 100 through a vapor deposition method. Then, a protective layer that is made of polyparaxylylene resin is formed in the thickness of 10 µm on the phosphor surface through the CVD method, an Al layer is then disposed in the thickness of 5000 Å on the protective layer as a reflective layer through the sputtering method, and a protective layer which is made of polyparaxylylene resin is formed in the thickness of 10 µm on the Al layer through the CVD method to obtain a reflective layer 116.

A moisture-proof protective layer 115 is prepared as in the first example, to thereby obtain a warp correction layer 114 having the light shielding function and the light absorption function as in the second example.

In addition, the moisture-proof protective layer 115 of the first example is bonded onto the reflective layer with an adhesive agent, and the sheet end portion is sealed at a sealing portion 122 with an acrylic resin. In addition, the resin film of the moisture-proof protective layer 115 is bonded onto the warp correction layer 114 so as to the drawing directions of the moisture-proof protective layer 115 and the warp correction layer 114 similar to each other to structure a radiation detection panel.

The radiation detection panel structured in the respective examples is used to structure a radiation detecting device. In the radiation detecting device thus structured, no warp occurs in the radiation detection panel during the process, and electric wiring connection can be excellently conducted by installing a crimp type terminal on an electrode lead pad potion on the panel.

In addition, the radiation detecting device manufactured as described above is stored in a temperature/moisture test pool of 60° C. and 90% for 1000 hours. As a result, there occurs no appearance failure such as an interlayer separation of the phosphor layer, the deterioration of the sensitivity is hardly recognized, and it can be confirmed that a radiation detecting device with a high reliability is obtained.

COMPARATIVE EXAMPLE

The radiation detection panel is obtained in the same manner as that of the first example except that a warp correction layer is not formed. The radiation panel thus obtained is installed in the casing while conducting electric connection to obtain the radiation detecting device.

In the device thus obtained, a defect in which a coating film that has been scratched during handling is partially broken is found out on a surface side of the radiation detection panel on which the photoelectric conversion elements are not formed. In addition, the radiation detecting device manufactured as described above is stored in a temperature/moisture test pool of 60° C. and 90% for 1000 hours. As a result, there occurs an image defect due to a separation failure which may result from a breakdown within the phosphor layer.

In addition, in the radiation detection panel structured in the same manner as that of the first example, in order to investigate the relationships between the thickness of the phosphor protective layer and the moisture-proof protective layer and the thickness of the warp correction layer, the thicknesses of the respective layers shown in Table 1 are changed to prepare the radiation detection panel.

TABLE 1

|  | Phosphor protective layer (μm) | Moisture-proof protective layer (μm) | Warp correction layer (μm) |
|---|---|---|---|
| Fourth Example | 150 | 50 | 100 |
| Fifth Example | 150 | 50 | 200 |
| Sixth Example | 150 | 50 | 250 |
| Comparative Example | 188 | 50 | 0 |

The amount of warp of the radiation detection panels structured in those examples and the comparative example are measured. In this measurement, the amount of warp is defined by the amount obtained by subtracting the thickness of the structural layers from the highest of the panel when the panel is placed on a plane.

In all of the radiation detection panels structured in the fourth, fifth and sixth examples, the amount of warp is smaller than that in the comparative example.

Also, the radiation detecting device is structured by the use of the radiation detection panel structured in those examples. In the radiation detecting device thus structured, there occurs no warp in the radiation detection panel during the process, and the electric wiring connection can be excellently conducted by installing the crimp type terminal on an electrode lead pad potion on the panel.

In addition, the radiation detecting device manufactured as described above is stored in a temperature/moisture test pool of 60° C. and 90% for 1000 hours. As a result, there occurs no appearance failure such as an interlayer separation of the phosphor layer, the deterioration of the sensitivity is hardly recognized, and it can be confirmed that a radiation detecting device with a high reliability is obtained.

As was described above, according to the present invention, there can be realized a radiation detecting device with a high reliability in which there occurs no warp of the radiation detection panel which is induced by a thermal displacement, the crimp of the electrode and the terminal on the panel is excellent, and there is no connection failure. According to the radiation detecting device of the present invention, the separation or breakdown of the phosphor does not occur, and the temperature-proof and moisture-proof property is particularly improved.

As many apparently widely different embodiments of the present invention can be made without departing from the spirit and scope thereof, it is to be understood that the invention is not limited to the specific embodiments thereof except as defined in the claims.

What is claimed is:

1. A radiation detecting device having a sensor panel in which a plurality of conversion elements are formed on one surface of a support substrate, comprising:
    a protective layer formed of a first resin film having a drawing or extrusion direction, which is disposed on a surface of the sensor panel on which the plurality of conversion elements are formed; and
    a second resin film having a drawing or extrusion direction, which is disposed on the other surface of the sensor panel,
    wherein the protective layer and the second resin film are so bonded onto the sensor panel that the respective drawing or extrusion directions of the protective layer and the second resin film are made similar to each other.

2. A radiation detecting device according to claim 1, wherein the protective layer comprises a moisture-proof protective layer.

3. A radiation detecting device according to claim 2, wherein a phosphor layer, a phosphor protective layer and the moisture-proof protective layer are sequentially laminated on the surface of the sensor panel on which the plurality of conversion elements are formed.

4. A radiation detecting device according to claim 3, wherein the phosphor protective layer comprises a third resin film having a drawing or extrusion direction which is similar to a drawing or extrusion direction of the moisture-proof protective layer.

5. A radiation detecting device according to claim 2, wherein a phosphor layer, a reflective layer and the moisture-proof protective layer are sequentially laminated on the surface of the sensor panel on which the plurality of conversion elements are formed.

6. A radiation detecting device according to claim 1, wherein the second resin film comprises a light shielding layer.

7. A radiation detecting device according to claim 1, wherein the sensor panel includes on one surface of the support substrate the plurality of conversion elements that convert a radiation directly into an electric signal.

8. A method of manufacturing a radiation detecting device comprising a sensor panel having a plurality of conversion elements formed on one surface of a supporting substrate, and a scintillator panel bonded to the sensor panel and having a phosphor layer for convening a radiation into light detectable by the plurality of conversion elements, comprising:
    bonding a moisture-proof protective layer that is formed of a first resin film having a drawing or extrusion direction onto the scintillator panel; and
    bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

9. A method of manufacturing a radiation detecting device comprising a sensor panel having a plurality of conversion elements formed on one surface of a supporting substrate, and a phosphor layer for converting a radiation into light detectable by the plurality of conversion elements, the phosphor layer being formed on a surface side of the sensor panel on which the conversion elements are provided, comprising:

bonding a moisture-proof protective layer that is formed of a first resin film having a drawing or extrusion direction on the phosphor layer; and bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

10. A method of manufacturing a radiation detecting device having a direct type sensor panel in which a plurality of conversion elements that convert radiation directly into electric signals are formed on one surface of a support substrate, comprising:

bonding a moisture-proof protective layer that is formed of a first resin film having a drawing or extrusion direction onto a surface of a direct type sensor panel on which the plurality of conversion elements that convert radiation directly into electric signal are formed; and bonding a second resin film having a drawing or extrusion direction onto a surface of the sensor panel on which the plurality of conversion elements are not formed with an adhesive layer so as to make the drawing or extrusion direction of the second resin film similar to that of the moisture-proof protective layer.

\* \* \* \* \*

UNITED STATES PATENT AND TRADEMARK OFFICE
CERTIFICATE OF CORRECTION

| | |
|---|---|
| PATENT NO. | : 7,105,830 B2 |
| APPLICATION NO. | : 10/795352 |
| DATED | : September 12, 2006 |
| INVENTOR(S) | : Kazumi Nagano et al. |

It is certified that error appears in the above-identified patent and that said Letters Patent is hereby corrected as shown below:

COVER PAGE:
Item (56) References Cited U.S. PATENT DOCUMENTS
"6,949,750 B1* 9/2005 Tsutsui et al." should read -- 6,949,750 B1* 9/2005 Tsutsui, et al. --.

COLUMN 1:
Line 28, delete "the"; and
Line 65, "durability," should read -- durability test, --.

COLUMN 2:
Line 1, "weak in" should read -- weakened by --;
Line 11, "potion" should read -- portion --; and
Line 54, "extrusiondirection" should read -- extrusion direction --.

COLUMN 3:
Line 38, "signal" should read -- signals --.

COLUMN 4:
Line 63, "there" should read -- it --.

COLUMN 6:
Line 53, "chroride" should read -- chloride --.

COLUMN 7:
Line 66, "portions;" should read -- portions, --.

COLUMN 8:
Line 11, "fo" should read -- of --;
Line 33, "to" should read -- to make --; and
Line 58, "6090.," should read -- 6090, --.

COLUMN 9:
Line 22, "188 im" should read -- 188 µm --;
Line 57, "(pixel)" should read -- (pixels) --; and
Line 59, "are" should read -- is --.

UNITED STATES PATENT AND TRADEMARK OFFICE
CERTIFICATE OF CORRECTION

PATENT NO. : 7,105,830 B2
APPLICATION NO. : 10/795352
DATED : September 12, 2006
INVENTOR(S) : Kazumi Nagano et al.

It is certified that error appears in the above-identified patent and that said Letters Patent is hereby corrected as shown below:

COLUMN 10:
Line 3, "100 im" should read -- 100 µm --;
Line 19, "(pixel)" should read -- (pixels) --;
Line 21, "are" should read -- is --;
Line 30, "500 im" should read -- 500 µm --;
Line 49, "to" should read -- to make --;
Line 60, "potion" should read -- portion --; and
Line 63, "C." should read -- C --.

COLUMN 11:
Lines 14 and 57, "C." should read -- C --; and
Line 54, "potion" should read -- portion --.

COLUMN 14:
Line 10, "signal" should read -- signals --.

Signed and Sealed this

Twelfth Day of June, 2007

JON W. DUDAS
*Director of the United States Patent and Trademark Office*